(12) United States Patent
Peng (10) Patent No.: US 9,373,589 B2
(45) Date of Patent: Jun. 21, 2016

(54) DISPLAY SUBSTRATE AND MANUFACTURING METHOD THEREOF AS WELL AS DISPLAY DEVICE

(71) Applicant: BOE TECHNOLOGY GROUP CO., LTD., Beijing (CN)

(72) Inventor: Kuanjun Peng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/572,731

(22) Filed: Dec. 16, 2014

(65) Prior Publication Data
US 2016/0141253 A1 May 19, 2016

(30) Foreign Application Priority Data

Nov. 18, 2014 (CN) .......................... 2014 1 0656213

(51) Int. Cl.
| | | |
|---|---|---|
| H01L 21/84 | (2006.01) |
| H01L 21/00 | (2006.01) |
| H01L 23/552 | (2006.01) |
| H01L 27/12 | (2006.01) |
| G02F 1/1368 | (2006.01) |
| G02F 1/1362 | (2006.01) |

(52) U.S. Cl.
CPC ............ *H01L 23/552* (2013.01); *G02F 1/1368* (2013.01); *G02F 1/136286* (2013.01); *H01L 27/124* (2013.01); *H01L 27/127* (2013.01); *H01L 27/1225* (2013.01); *H01L 27/1262* (2013.01)

(58) Field of Classification Search
CPC ...................... H01L 21/0231; H01L 21/02348; H01L 21/02642; H01L 21/02672; H01L 21/28079; H01L 21/3141; H01L 27/1251; H01L 27/124; H01L 27/1463; H01L 28/65; H01L 29/4908; H01L 29/7816; H01L 29/7869; H01L 29/765; H01L 51/0508
USPC ............. 438/149, 30, 75, 535, 608, 787, 786, 438/197; 257/213, 288, 359, E21.006, 257/E21.05, E21.051, E21.053, E21.126, 257/E21.127, E21.134, E21.185, E21.267, 257/E21.278, E21.293, E21.347, E21.352, 257/E21.366
See application file for complete search history.

(56) References Cited

U.S. PATENT DOCUMENTS

| | | | | |
|---|---|---|---|---|
| 8,735,872 B2* | 5/2014 | Kim | ..................... | H01L 27/3267 257/40 |
| 8,754,404 B2* | 6/2014 | Jung | ..................... | H01L 27/322 257/40 |
| 9,224,791 B2* | 12/2015 | Kim | ..................... | H01L 27/3246 |
| 2014/0061632 A1* | 3/2014 | Lee | ..................... | H01L 27/1225 257/43 |
| 2015/0219944 A1* | 8/2015 | Mitsumoto | ........... | G02F 1/1345 349/138 |

* cited by examiner

*Primary Examiner* — David Nhu
(74) *Attorney, Agent, or Firm* — Blakely Sokoloff Taylor & Zafman LLP (57) ABSTRACT

The embodiments of the present invention provide a display substrate and a manufacturing method thereof, as well as a display device including the display substrate. The display substrate may include a base substrate and a thin film transistor arranged on the base substrate, the thin film transistor having a gate, a gate insulating layer, an oxide semiconductor active layer as well as a source electrode and a drain electrode arranged on the base substrate sequentially; the display substrate may further include an ultraviolet blocking layer, the ultraviolet blocking layer having a first portion arranged between the base substrate and the oxide semiconductor active layer. By arranging the ultraviolet blocking layer, the influence of ultraviolet light on the oxide semiconductor active layer can be mitigated or avoided.

17 Claims, 6 Drawing Sheets

DISPLAY SUBSTRATE AND MANUFACTURING METHOD THEREOF AS WELL AS DISPLAY DEVICE

FIELD OF THE INVENTION

The present invention relates to the display technology, particularly to a display substrate and a manufacturing method thereof as well as a display device.

BACKGROUND OF THE INVENTION

Display devices such as liquid crystal display devices are widely used in various fields. For a liquid crystal display device, it generally comprises display substrates (such as an array substrate and a color film substrate) and a liquid crystal layer arranged between the display substrates. With the development of the display technology, a thin film transistor comprising an oxide semiconductor active layer may be applied in the display substrate. Such a thin film transistor has a relatively high carrier mobility and a relatively low leakage current, therefore it is favorable for achieving integration, thinness and lightness, high image quality and low power consumption of the display device.

However, the oxide semiconductor is generally sensitive to light, particularly ultraviolet light. Therefore, when the thin film transistor comprising an oxide semiconductor active layer is applied in a display substrate such as an array substrate, the property of the oxide semiconductor in the active layer may be easily changed and produce flaws under the irradiation of the ultraviolet light (for example, the ultraviolet light contained in backlight), thereby rendering malfunction of the display substrate and the display device comprising the display substrate.

SUMMARY OF THE INVENTION

Therefore, it is desired to provide an improved display substrate and a display device which can mitigate or avoid the above problem.

According to an aspect of the present invention, a display substrate is provided, which may comprise a base substrate and a thin film transistor arranged on the base substrate, the thin film transistor comprising a gate, a gate insulating layer, an oxide semiconductor active layer as well as a source electrode and a drain electrode arranged on the base substrate sequentially. The display substrate may further comprise an ultraviolet blocking layer, the ultraviolet blocking layer comprising a first portion arranged between the base substrate and the oxide semiconductor active layer.

As mentioned above, when the thin film transistor comprising an oxide semiconductor active layer is applied in a display substrate such as an array substrate, the property of the oxide semiconductor in the active layer may be easily changed and produce flaws under the irradiation of the ultraviolet light (for example, the ultraviolet light contained in backlight). Therefore, it has been proposed that the area of the gate located under the active layer is made slightly larger than the area of the active layer so as to avoid influence of the ultraviolet light to the active layer.

The inventor has recognized that although the above solution can mitigate the bad influence caused by the ultraviolet light component in the backlight to the oxide semiconductor active layer to some extent, since the light ray of the backlight is scattered, there is still some light that arrives at the active layer inevitably, thereby rendering degradation of the active layer. Therefore, the inventor proposes to arrange an ultraviolet blocking layer in the display substrate, and the ultraviolet blocking layer may comprise a portion arranged between the base substrate and the oxide semiconductor active layer. By means of such an ultraviolet blocking layer, the ultraviolet light can be at least partly or completely blocked, thereby mitigating or avoiding influence of the ultraviolet light to the active layer and improving yield of the product.

According to an embodiment of the present invention, the ultraviolet blocking layer may comprise indium tin oxide (ITO) or indium zinc oxide (IZO).

In order to prevent the ultraviolet light from reaching the oxide semiconductor active layer, the material for forming the ultraviolet blocking layer should be able to block the ultraviolet light effectively. The inventor finds from investigation that ITO or IZO has good absorption properties to light of the ultraviolet band. Therefore, by enabling the ultraviolet blocking layer to comprise ITO or IZO, a good effect of blocking the ultraviolet light can be achieved by absorbing the ultraviolet light.

According to another embodiment of the present invention, the first portion of the ultraviolet blocking layer may be arranged between the base substrate and the gate.

According to another embodiment of the present invention, the first portion of the ultraviolet blocking layer at least partly overlaps with a projection area of the oxide semiconductor active layer on a plane where the ultraviolet blocking layer locates. In this way, the projection area of the oxide semiconductor active layer on the plane wherein the ultraviolet blocking layer locates may be partly or completely located within the perimeter of the first portion of the ultraviolet blocking layer, thereby being capable of achieving a better effect of blocking the ultraviolet light.

According to another embodiment of the present invention, the display substrate may further comprise a gate line arranged on the base substrate and a data line located above the gate line and electrically connected with one of the source electrode and the drain electrode of the thin film transistor. An oxide semiconductor active cushion is arranged between the gate line and the data line at the crossover of the gate line and the data line, and the ultraviolet blocking layer may further comprise a second portion arranged between the base substrate and the oxide semiconductor active cushion.

In general, there may be a plurality of pixel areas on a display substrate for use in a display device for realizing the display function, and the plurality of pixel areas may be defined by a plurality of gate lines and a plurality of data lines comprised by the display substrate. In such a display substrate, there are many crossovers of the gate lines and the data lines. By arranging an oxide semiconductor active cushion between the gate line and the data line at the crossover of the gate line and the data line, the capacitance between the gate line and the data line can be reduced, and the cross section slope angle can also be further improved so as to reduce break of lines.

However, due to sensitivity of the oxide semiconductor to the ultraviolet light, such an oxide semiconductor active cushion may be influenced by ultraviolet light, e.g., the ultraviolet light component in backlight. Therefore, the inventor proposes to enable the above ultraviolet blocking layer to further comprise a second portion arranged between the base substrate and the oxide semiconductor active cushion. That is, the second portion of the ultraviolet blocking layer is arranged under the oxide semiconductor active cushion at the crossover of the gate line and the data line. By means of such an ultraviolet blocking layer, the ultraviolet light can be at least partly or completely blocked, thereby mitigating or avoiding influence of the ultraviolet light to the active cushion and improving yield of the product.

According to a further embodiment of the present invention, the second portion of the ultraviolet blocking layer may be arranged between the base substrate and the gate line.

According to a further embodiment of the present invention, the display substrate may further comprise a transparent conducting layer arranged on the base substrate, the transparent conducting layer being located in a pixel area of the display substrate and being in the same layer as the ultraviolet blocking layer. It is particularly beneficial when such a display substrate is applied in a liquid crystal display device that operates in an ADS display mode.

For a liquid crystal display device, there are display modes such as ADS, TN, IPS, VA and so on. Wherein the ADS display mode has good viewing angle, response speed and color performance. In order to enable the liquid crystal display device to operate in the ADS display mode, when manufacturing a display substrate (e.g. an array substrate) comprised by the liquid crystal display device, a transparent conducting layer (e.g. an ITO or IZO layer) located in a pixel area of the display substrate will be formed on the base substrate firstly. As to be mentioned in the following, by forming a transparent conducting layer and an ultraviolet blocking layer according to the embodiment of the present invention in the same process step so as to enable the transparent conducting layer and the ultraviolet blocking layer to be in the same layer, the influence of ultraviolet light to the oxide semiconductor active layer can be mitigated or avoided without adding any manufacturing cost.

According to a further embodiment of the present invention, the second portion of the ultraviolet blocking layer at least partly overlaps with a projection area of the oxide semiconductor active cushion on a plane where the ultraviolet blocking layer locates. In this way, the projection area of the oxide semiconductor active cushion on the plane where the ultraviolet blocking layer locates may be partly or completely located within the perimeter of the second portion of the ultraviolet blocking layer, thereby being capable of achieving a better effect of blocking the ultraviolet light.

According to another aspect of the present invention, a method for manufacturing a display substrate is provided, the method may comprise: forming a gate, a gate insulating layer, an oxide semiconductor active layer as well as a source electrode and a drain electrode on a base substrate sequentially, so as to form a thin film transistor. The method may further comprise: forming an ultraviolet blocking layer before forming the oxide semiconductor active layer such that the ultraviolet blocking layer comprises a first portion arranged between the base substrate and the oxide semiconductor active layer.

According to an embodiment of the present invention, the ultraviolet blocking layer may comprise ITO or IZO.

According to another embodiment of the present invention, an ultraviolet blocking layer may be formed before the gate is formed, such that the first portion of the ultraviolet blocking layer is arranged between the base substrate and the gate.

According to another embodiment of the present invention, the area of the first portion of the ultraviolet blocking layer may be larger than or equal to the area of the oxide semiconductor active layer.

According to another embodiment of the present invention, the step of forming a gate may further comprise forming a gate line; the step of forming an oxide semiconductor active layer may further comprise forming an oxide semiconductor active cushion located above the gate line; and the step of forming a source electrode and a drain electrode may further comprise forming a data line electrically connected with one of the source electrode and the drain electrode. Moreover, the ultraviolet blocking layer may further comprise a second portion arranged between the base substrate and the oxide semiconductor active cushion According to a further embodiment of the present invention, the second portion of the ultraviolet blocking layer may be arranged between the base substrate and the gate line.

According to a further embodiment of the present invention, the step of forming an ultraviolet blocking layer may further comprise forming a transparent conducting layer on the base substrate.

According to a further embodiment of the present invention, the area of the second portion of the ultraviolet blocking layer may be larger than or equal to the area of the oxide semiconductor active cushion.

According to a further aspect of the present invention, a display device is provided, which may comprise the above display substrate. The display device for example may be a liquid crystal display device. The liquid crystal display device may operate in an ADS display mode.

BRIEF DESCRIPTION OF DRAWINGS

Now, the concept and additional advantages of the present invention will be described through nonrestrictive embodiments with reference to the drawings.

DETAILED DESCRIPTION OF THE INVENTION

Next, the display substrate, the display device and the manufacturing method of the display substrate according to embodiments of the present invention will be explained by way of examples with reference to the drawings. The drawings are schematic, are not drawn to scale, and are only for explaining the embodiments of the present invention rather than intending to limit the protection scope of the present invention.

It should be understood that when it is stated that an element or a layer is "on", "connected to" or "coupled to" another element or layer, it can be on, connected to or coupled to another element or layer directly, or there may also be an inserted element or layer. On the contrary, when it is stated that an element is "directly on", "directly connected to" or "directly coupled to" another element or layer, no inserted element or layer exists.

Figure 1:
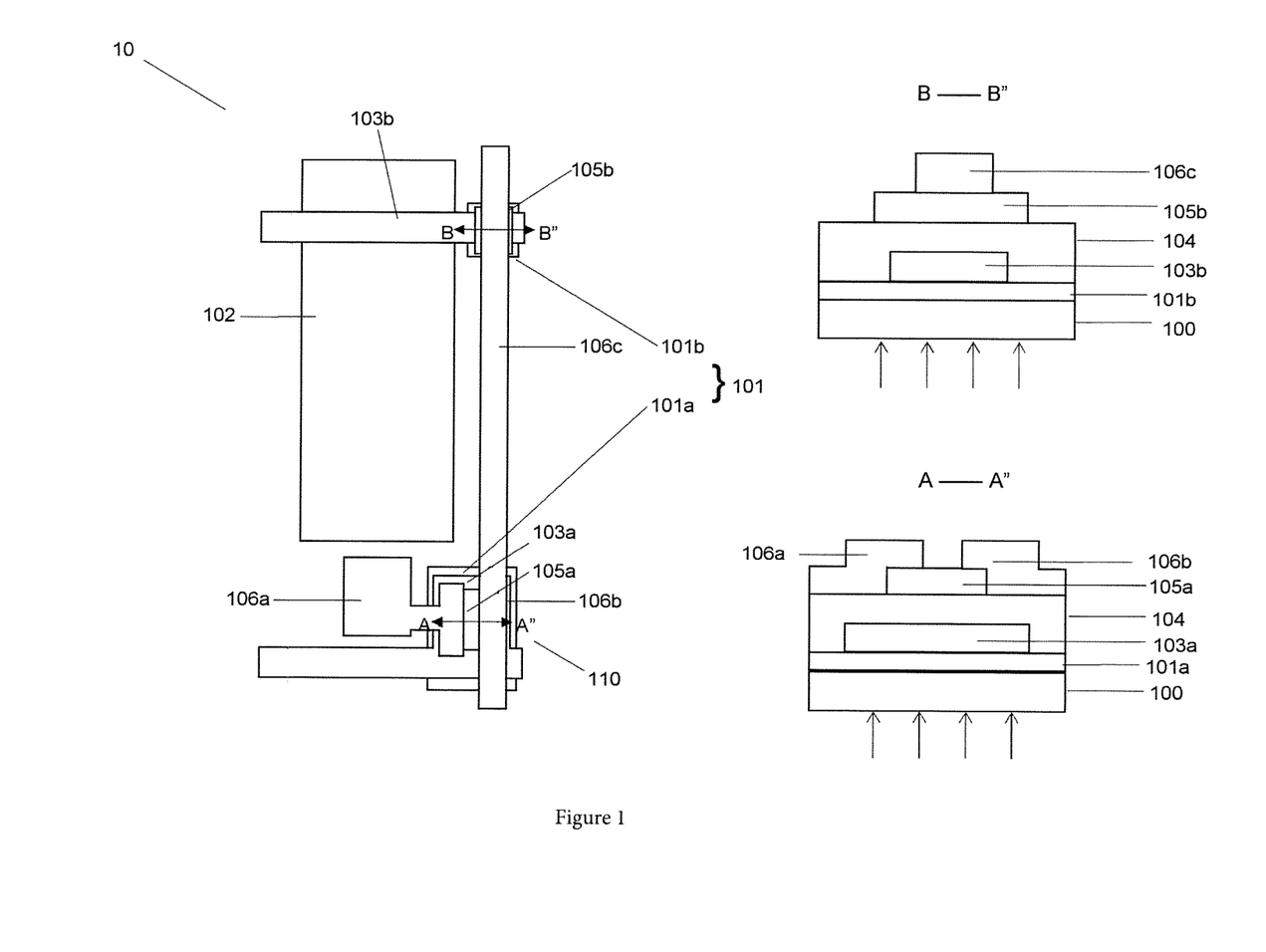
FIG. 1 schematically shows a display substrate according to an embodiment of the present invention in the form of a top view and a sectional view.

FIG. 1 schematically shows a display substrate according to an embodiment of the present invention. The left side of FIG. 1 shows a top view of the display substrate, and the right side of FIG. 1 shows partial sectional views of the display substrate along A-A" direction and B-B' direction respectively. The upward arrows in the partial sectional views represent light rays, which for example may be backlight.

As shown in FIG. 1, a display substrate 10 may comprise a base substrate 100 and a thin film transistor 110 arranged on the base substrate 100. The thin film transistor 110 may comprise a gate 103a, a gate insulating layer 104, an oxide semiconductor active layer 105a as well as a source electrode 106a and a drain electrode 106b arranged on the base substrate 100 sequentially. The display substrate 10 may further comprise an ultraviolet blocking layer 101, and the ultraviolet blocking layer 101 may comprise a first portion 101a arranged between the base substrate 100 and the oxide semiconductor active layer 105a.

For the sake of clarity, in the top view at the left side of FIG. 1, the base substrate 100 and the gate insulating layer 104 are not shown.

By arranging the ultraviolet blocking layer 101, the ultraviolet light can be at least partly or completely blocked, thereby mitigating or avoiding the influence of the ultraviolet light, e.g., the ultraviolet light component in the backlight, to the active layer, and improving yield of the product.

According to an exemplary embodiment of the present invention, the base substrate 100 for example may be a glass base substrate. The gate 103a may comprise a metal material, the metal material for example being selected from a group consisting of tungsten, aluminum, copper, silver, molybdenum and an alloy thereof. The gate insulating layer 104 for example may be formed by a single layer of silicon nitride ($SiN_x$), silicon oxide ($SiO_2$) or silicon oxynitride (SiNO), or formed by a multilayer structure consisting of these materials. The oxide semiconductor active layer 105a comprises an oxide semiconductor, and the oxide semiconductor for example may be zinc oxide (ZnO), indium gallium zinc oxide (IGZO) or indium tin zinc oxide (ITZO) and so on. The source electrode 106a and the drain electrode 106b may comprise metal materials, the metal materials for example being selected from a group consisting of tungsten, aluminum, copper, silver, molybdenum and an alloy thereof.

The ultraviolet blocking layer 101 for example may comprise indium tin oxide (ITO) or indium zinc oxide (IZO). As mentioned above, in order to prevent the ultraviolet light from reaching the oxide semiconductor active layer, the material for forming the ultraviolet blocking layer should be able to block the ultraviolet light effectively. Since the ITO or IZO has good absorption properties to the light of the ultraviolet band, by enabling the ultraviolet blocking layer 101 to comprise ITO or IZO, a good effect of blocking the ultraviolet light can be achieved by absorbing the ultraviolet light. Certainly, the material for forming the ultraviolet blocking layer 101 is not limited to ITO or IZO. The material for forming the ultraviolet blocking layer can be selected based on specific applications and requirements, as long as it can achieve the effect of blocking the ultraviolet light.

Although it is not shown in FIG. 1, a passivation layer can be further formed on the structure as shown in FIG. 1 and a pixel electrode is formed on the passivation layer so as to enable the pixel electrode to be electrically connected with the source electrode or the drain electrode of the thin film transistor through a via hole arranged in the passivation layer. The passivation layer may be formed by a single layer of silicon nitride ($SiN_x$), silicon oxide ($SiO_2$) or silicon oxynitride (SiNO), or formed by a multilayer structure consisting of these materials. The pixel electrode may be formed by ITO or IZO. Since the structures of the passivation layer and the pixel electrode are well known by the skilled person in the art, they will not be described in detail here.

As shown in FIG. 1, a first portion 101a of the ultraviolet blocking layer for example may be arranged between the base substrate 100 and the gate 103a. Further, the first portion 101a of the ultraviolet blocking layer for example may be in direct contact with the base substrate 100 and the gate 103a. However, the position of the ultraviolet blocking layer is not limited to this. The specific position of the ultraviolet blocking layer can be selected based on specific applications and requirements, as long as it is located under the oxide semiconductor active layer 105a.

Further, the first portion 101a of the ultraviolet blocking layer may be at least partly overlap with a projection area of the oxide semiconductor active layer 105a on a plane where the ultraviolet blocking layer locates. In this way, the projection area of the oxide semiconductor active layer 105a on the plane where in the ultraviolet blocking layer locates may be partly or completely located within the perimeter of the first portion 101a of the ultraviolet blocking layer, thereby being capable of achieving a better effect of blocking the ultraviolet light.

According to an exemplary embodiment of the present invention, the display substrate 10 for example may further comprise a gate line 103b arranged on the base substrate 100 and a data line 106c located above the gate line 103b and electrically connected with one of the source electrode 106a and the drain electrode 106b of the thin film transistor 110. In the display substrate as shown in FIG. 1, the data line electrically connected with the drain electrode is taken as the example. In addition, an oxide semiconductor active cushion 105b may be further arranged between the gate line and the data line at the crossover of the gate line 103b and the data line 106c. The ultraviolet blocking layer 101 for example may further comprise a second portion 101b arranged between the base substrate 100 and the oxide semiconductor active cushion 105b.

According to an exemplary embodiment of the present invention, the gate 103b for example may comprise a metal material, the metal material for example being selected from a group consisting of tungsten, aluminum, copper, silver, molybdenum and an alloy thereof. The oxide semiconductor active cushion 105b comprises an oxide semiconductor, and the oxide semiconductor for example may be zinc oxide (ZnO), indium gallium zinc oxide (IGZO) or indium tin zinc oxide (ITZO) and so on. The data line 106c may comprise a metal material, the metal material for example being selected from a group consisting of tungsten, aluminum, copper, silver, molybdenum and an alloy thereof As mentioned above, by arranging an oxide semiconductor active cushion 105b between the gate line and the data line at the crossover of the gate line 103b and the data line 106c, the capacitance between the gate line and the data line can be reduced, and the cross section slope angle can also be further improved so as to reduce break of lines.

In order to mitigate or eliminate the influence of the ultraviolet light to the oxide semiconductor active cushion 105b, the ultraviolet blocking layer 101 may further comprise a second portion 101b arranged between the base substrate 100 and the oxide semiconductor active cushion 105b. Certainly, in the case of not arranging the oxide semiconductor active cushion, the ultraviolet blocking layer 101 does not need to comprise the second portion 101b.

As shown in FIG. 1, the second portion 101b of the ultraviolet blocking layer 101 for example may be arranged between the base substrate 100 and the gate line 103b. Further, the second portion 101b of the ultraviolet blocking layer 101 for example may be in direct contact with the base substrate 100 and the gate line 103b. However, the position of the ultraviolet blocking layer is not limited to this. The specific position of the ultraviolet blocking layer can be selected based on specific applications and requirements, as long as it is located under the oxide semiconductor active cushion 105b.

Further, the second portion 101b of the ultraviolet blocking layer may be at least partly overlap with a projection area of the oxide semiconductor active cushion 105b on a plane where the ultraviolet blocking layer locates. In this way, the projection area of the oxide semiconductor active layer 105b on the plane where in the ultraviolet blocking layer locates may be partly or completely located within the perimeter of the second portion 101b of the ultraviolet blocking layer, thereby being capable of achieving a better effect of blocking the ultraviolet light.

According to an exemplary embodiment of the present invention, the display substrate 10 for example may further comprise a transparent conducting layer 102 arranged on the base substrate 100, as shown in FIG. 1. The transparent conducting layer 102 is located at a pixel area of the display substrate 10 and is in the same layer as the ultraviolet blocking layer 101. The transparent conducting layer 102 may be formed by the same material as that for forming the ultraviolet blocking layer 101. For example, the transparent conducting layer 102 may be formed by ITO or IZO. It is particularly beneficial when such a display substrate is applied in a liquid crystal display device operating in an ADS display mode.

For a liquid crystal display device, there are display modes such as ADS, TN, IPS, VA and so on. The ADS display mode has good viewing angle, response speed and color performance. In order to enable the display substrate 10 to be used in a liquid crystal display device that operates in the ADS display mode, the transparent conducting layer 102 located in the pixel area of the display substrate 10 can be formed on the base substrate 100 and the transparent conducting layer 102 is made to be in the same layer as the ultraviolet blocking layer. Such a configuration of the display substrate allows forming the transparent conducting layer and the ultraviolet blocking layer in the same process step simultaneously. Therefore, the influence of ultraviolet light to the oxide semiconductor active layer can be mitigated or avoided without adding any manufacturing cost.

It should be noted that the display substrate according to the embodiment of the present invention can not only be applied in a liquid crystal display device that operates in the ADS display mode, it can also be applied in a liquid crystal display device that operates in other display modes (e.g. TN, IPS, VA). In the case of being applied in a liquid crystal display device that operates in the display modes of TN, IPS, VA etc., the transparent conducting layer 102 may not be formed.

For the sake of conciseness, FIG. 1 only shows one thin film transistor and one crossover position of the gate line and the data line. However, it should be noted that the display substrate may comprise a plurality of thin film transistors as well as a plurality of gate lines and a plurality of data lines. Hence, a plurality of crossover positions of the gate lines and the data lines may exist in the display substrate.

According to an embodiment of the present invention, a display device is further provided, which may comprise the above display substrate 10.

The display device for example may be a liquid crystal display device. In such a case, the display substrate 10 may be an array substrate of the liquid crystal display device. Further, the liquid crystal display device for example may operate in an ADS display mode.

FIGS. 2A-2E schematically show a method for manufacturing a display substrate) according to an embodiment of the present invention in the form of a top view and a sectional view. The method for manufacturing a display substrate according to the embodiment of the present invention may comprise: forming a gate, a gate insulating layer, an oxide semiconductor active layer as well as a source electrode and a drain electrode on a base substrate sequentially, so as to form a thin film transistor; the method may further comprise: forming an ultraviolet blocking layer before forming the oxide semiconductor active layer such that the ultraviolet blocking layer comprises a first portion arranged between the base substrate and the oxide semiconductor active layer.

Next, with respect to a specific example of the method for manufacturing a display substrate, the method for manufacturing a display substrate according to the embodiment of the present invention will be illustrated with reference to FIGS. 2A-2E. It should be noted that the steps shown in FIGS. 2A-2E are only exemplary rather than limitation to the present invention.

Figure 2A:
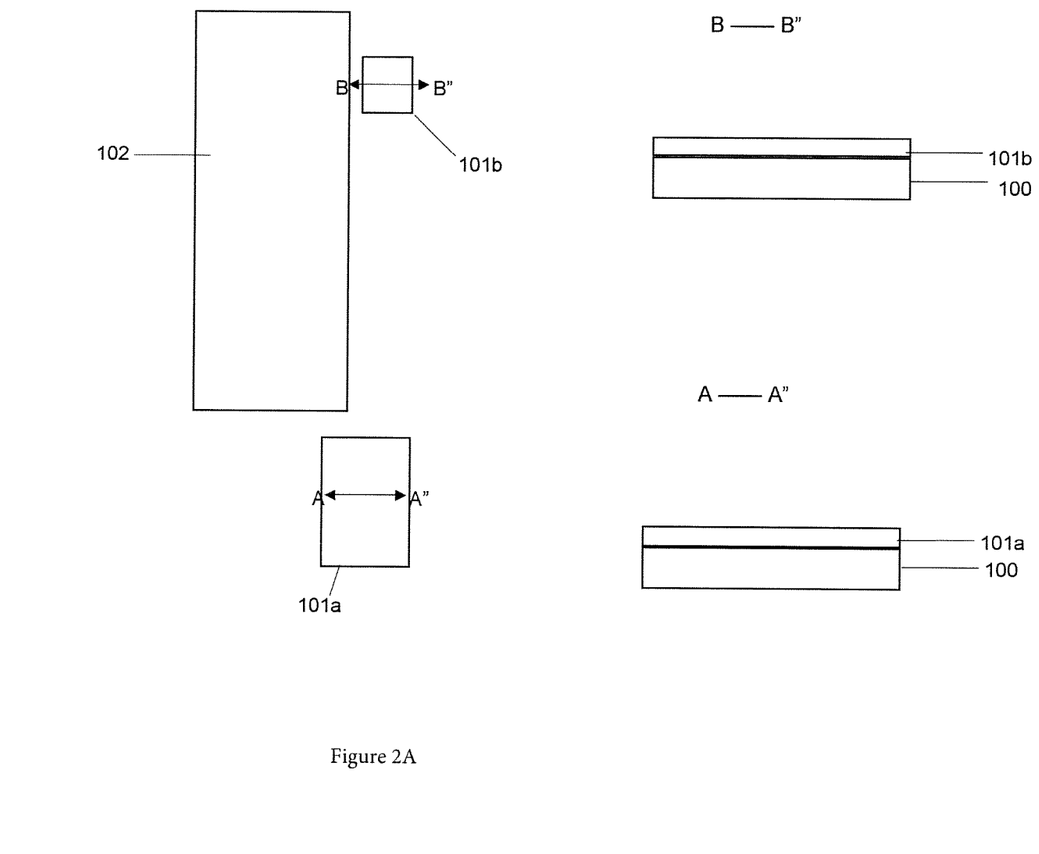
FIGS. 2A-2E schematically show a method for manufacturing a display substrate according to an embodiment of the present invention in the form of a top view and a sectional view.

As shown in FIG. 2A, an ultraviolet blocking layer 101 is formed on the base substrate 100. The ultraviolet blocking layer 101 may comprise a first portion 101a arranged on the base substrate 100. By arranging the ultraviolet blocking layer 101, the influence of the ultraviolet light, e.g. the ultraviolet light component in the backlight, to the subsequently formed oxide semiconductor active layer can be mitigated or avoided.

Further, the ultraviolet blocking layer 101 for example may further comprise a second portion 101b arranged on the base substrate 100, thereby being capable of further mitigating or avoiding the influence of the ultraviolet light to the subsequently formed oxide semiconductor active cushion located between the gate line and the data line. Certainly, in the case of not arranging the oxide semiconductor active cushion, the ultraviolet blocking layer 101 does not need to comprise the second portion 101b.

Although in FIG. 2A, the first portion 101a and the second portion 101b of the ultraviolet blocking layer are shown as being arranged on the base substrate 100, the position of the ultraviolet blocking layer is not limited to this. The specific position of the ultraviolet blocking layer can be selected based on specific applications and requirements, as long as its first portion and second portion are located under the subsequently formed oxide semiconductor active layer and oxide semiconductor active cushion respectively.

According to an exemplary embodiment of the present invention, the base substrate 100 for example may be a glass base substrate. The ultraviolet blocking layer 101 for example may comprise indium tin oxide (ITO) or indium zinc oxide (IZO).

According to an exemplary embodiment of the present invention, the step of forming the ultraviolet blocking layer 101 may further comprise forming a transparent conducting layer 102 on the base substrate. Namely, the ultraviolet blocking layer 101 and the transparent conducting layer 102 can be formed on the base substrate 100 simultaneously, such that the transparent conducting layer 102 is located in the pixel area of the display substrate 10 and in the same layer as the ultraviolet blocking layer 101, as shown in FIG. 2A. As stated above, it is particularly beneficial when such a display substrate is applied into a liquid crystal display device operating in an ADS display mode.

Certainly, the display substrate according to the embodiment of the present invention can not only be applied into a liquid crystal display device that operates in the ADS display mode, it can also be applied into a liquid crystal display device that operates in other display modes (e.g. TN, IPS, VA). In the case of being applied into a liquid crystal display device that operates in the display modes of TN, IPS, VA etc., the transparent conducting layer 102 may not be formed.

As an example of the specific process step, a layer of ITO or IZO can be deposited on the glass base substrate, then a desired pattern is formed through exposing, developing and etching, and the pattern comprises the above ultraviolet blocking layer and the transparent conducting layer. Certainly, the specific process step is not a limitation to the present invention. The skilled person in the art may also select other materials and manners for forming the ultraviolet blocking layer and the transparent conducting layer based on specific applications and requirements.

Figure 2B:
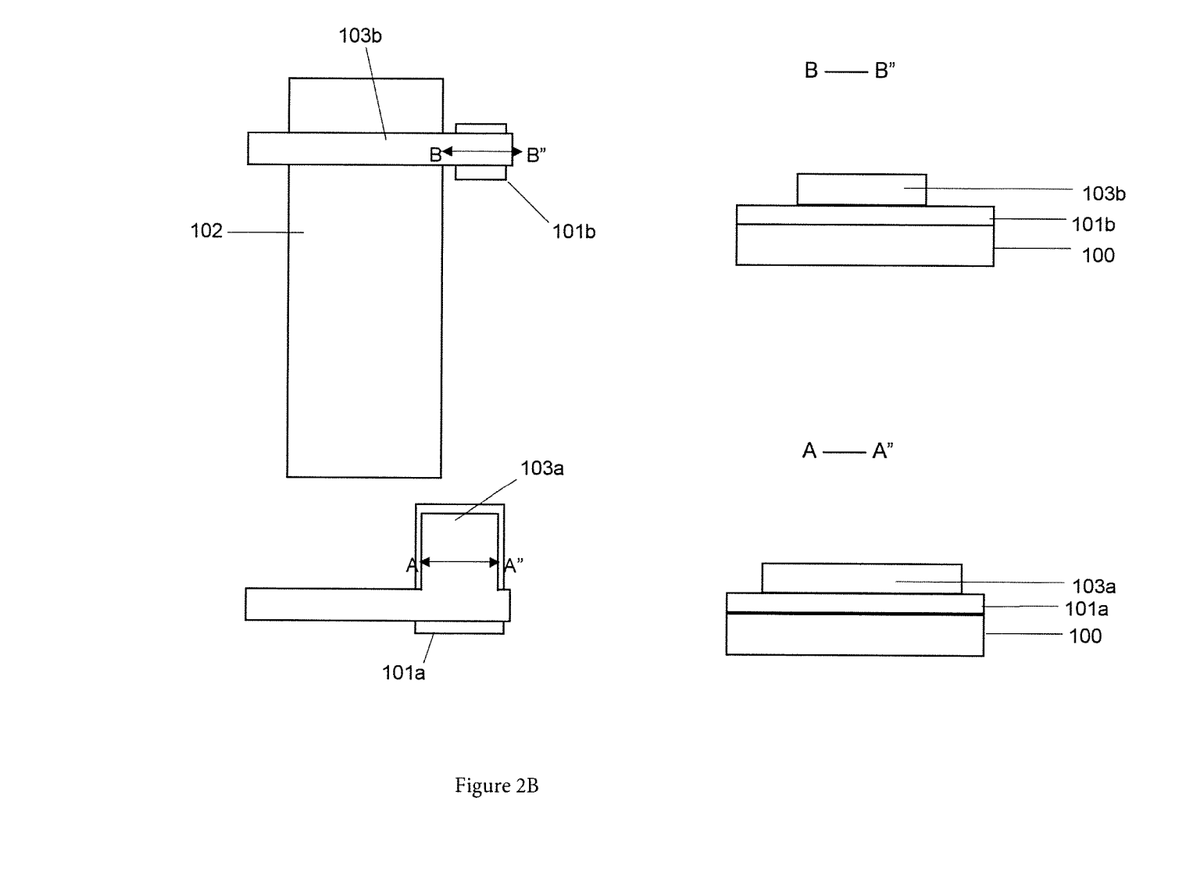

As shown in FIG. 2B, a gate 103a is formed on the first portion 101a of the ultraviolet blocking layer 101.

According to an exemplary embodiment of the present invention, the step for forming the gate may further comprise forming a gate line 103b. That is, the gate 103a and the gate line 103b can be formed on the structure as shown in FIG. 2A simultaneously, as shown in FIG. 2B.

Since the ultraviolet blocking layer 101 is formed before the gate and the gate line are formed, the first portion 101a of the ultraviolet blocking layer 101 can be arranged between the base substrate 100 and the gate 103a and the second portion 101b of the ultraviolet blocking layer 101 can be arranged between the base substrate 100 and the gate line 103b.

As an example of the specific process step, the gate and the gate line material can be deposited on the structure as shown in FIG. 2A, then a desired pattern is formed through exposing, developing and etching, and the pattern comprises the above gate and the gate line. The gate and the gate line may comprise a metal material, the metal material for example being selected from a group consisting of tungsten, aluminum, copper, silver, molybdenum and an alloy thereof. Certainly, the specific process step is not a limitation to the present invention. The skilled person in the art may also select other materials and manners for forming the gate and the gate line based on specific applications and requirements.

Figure 2C:
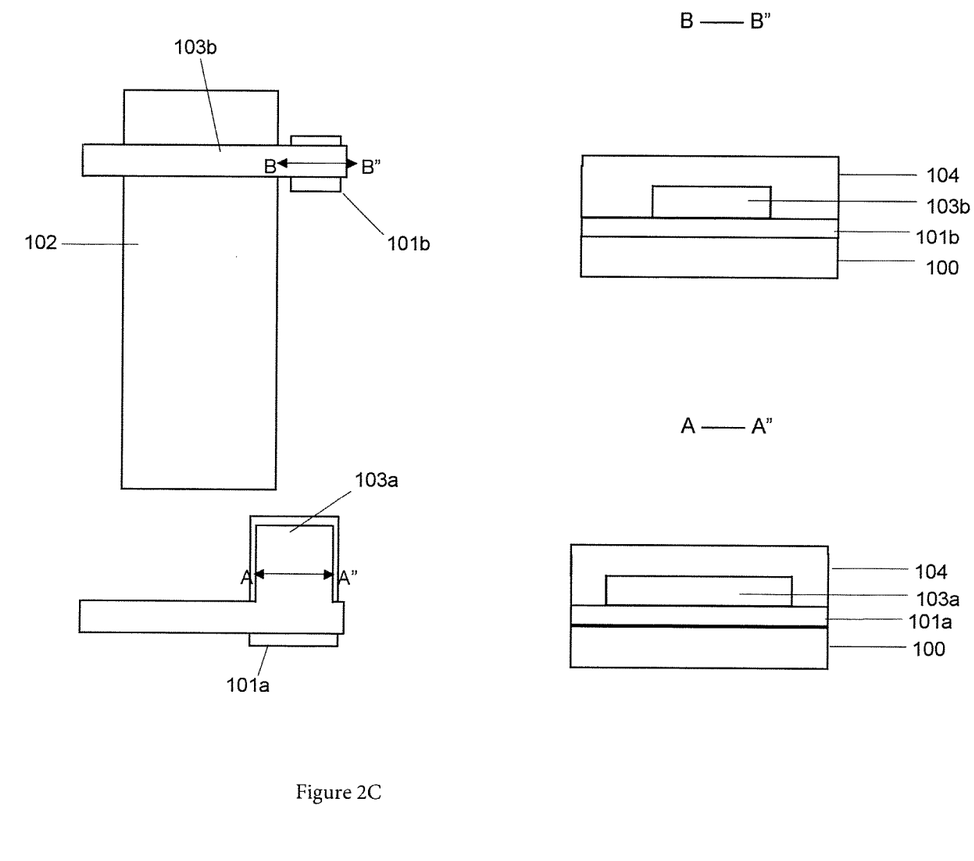

As shown in FIG. 2C, a gate insulating layer 104 is formed on the structure as shown in FIG. 2B. The gate insulating layer 104 for example may cover the gate 103a and the gate line 103b as well as part of the ultraviolet blocking layer 101 and the transparent conducting layer 102. For the sake of clarity, in the top view at the left side of FIG. 2C, the gate insulating layer 104 is not shown.

As an example of the specific process step, a gate insulating layer can be formed through deposition on the structure as shown in FIG. 2B. The gate insulating layer for example may be formed by a single layer of silicon nitride ($SiN_x$), silicon oxide ($SiO_2$) or silicon oxynitride (SiNO), or formed by a multilayer structure consisting of these materials. Certainly, the specific process step is not a limitation to the present invention. The skilled person in the art may also select other materials and manners for forming the gate insulating layer based on specific applications and requirements.

Figure 2D:
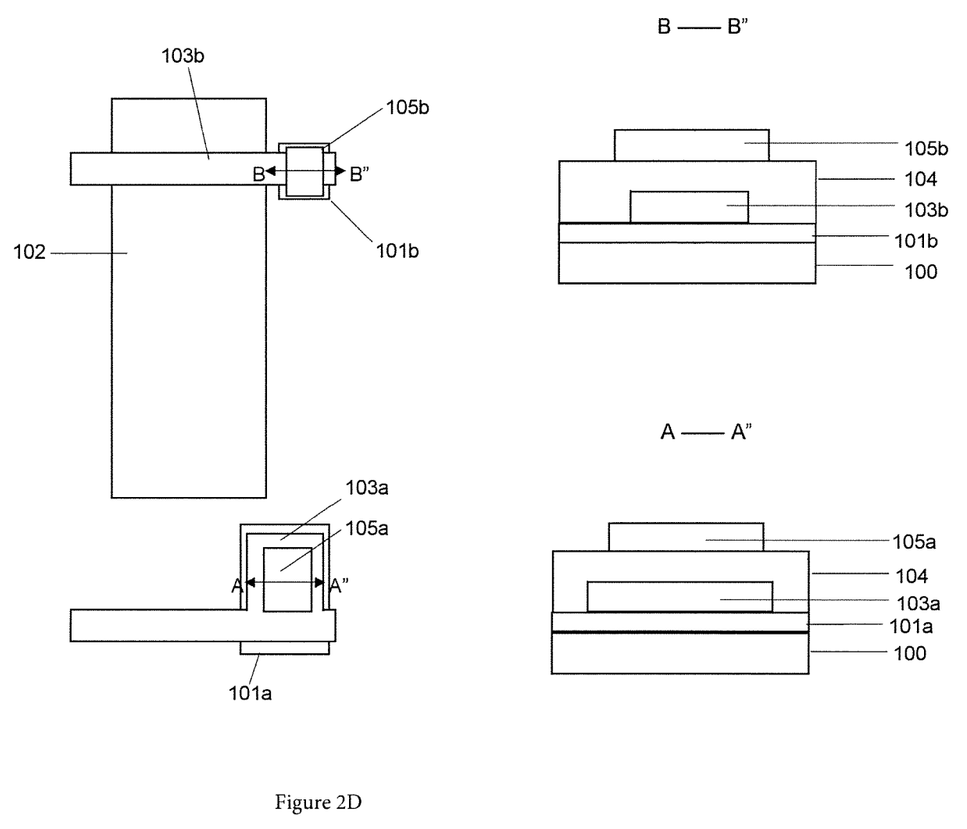

As shown in FIG. 2D, an oxide semiconductor active layer 105a is formed on the gate insulating layer 104.

According to an exemplary embodiment of the present invention, the step of forming the oxide semiconductor active layer may further comprise fondling an oxide semiconductor active cushion 105b located above the gate line 103b. That is, the oxide semiconductor active layer 105a and the oxide semiconductor active cushion 105b can be formed on the gate insulating layer 104 simultaneously, as shown in FIG. 2D.

Figure 2E:
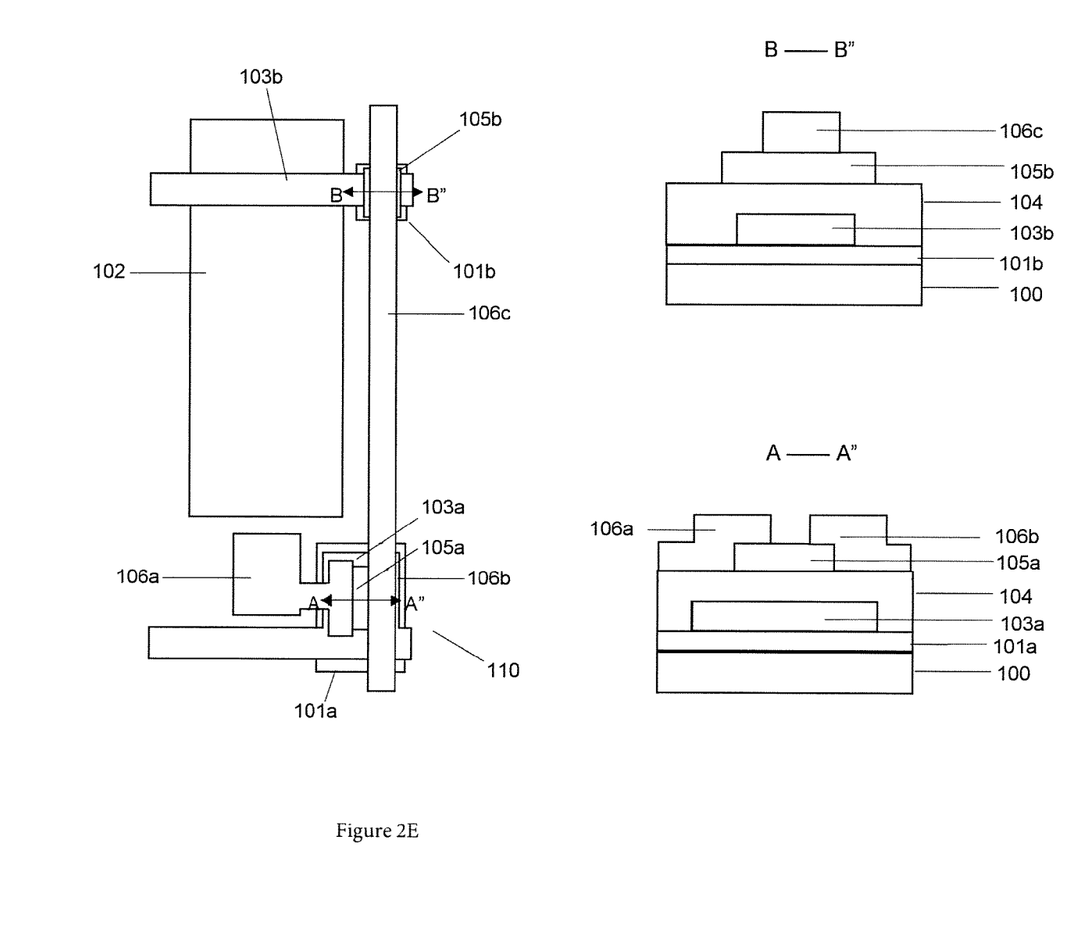

As an example of the specific process step, an active material can be deposited on the gate insulating layer, then a desired pattern is formed through exposing, developing and etching, and the pattern comprises the above oxide semiconductor active layer and oxide semiconductor active cushion. The active material comprises an oxide semiconductor, and the oxide semiconductor for example may be zinc oxide (ZnO), indium gallium zinc oxide (IGZO) or indium tin zinc oxide (ITZO) and so on. Certainly, the specific process step is not a limitation to the present invention. The skilled person in the art may also select other materials and manners for forming the oxide semiconductor active layer and the oxide semiconductor active cushion based on specific applications and requirements As shown in FIG. 2E, a source electrode 106a and a drain electrode 106b are formed so as to form a thin film transistor 110. The source electrode 106a and the drain electrode 106b may be arranged on the oxide semiconductor active layer 105a and on part of the gate insulating layer 104.

According to an exemplary embodiment of the present invention, the step of forming the source electrode and the drain electrode may further comprise forming a data line 106c electrically connected with one of the source electrode 106a and the drain electrode 106b. That is, the source electrode 106a, the drain electrode 106b and the data line 106c can be formed simultaneously. The data line 106c may be arranged on the oxide semiconductor active cushion 105b and on part of the gate insulating layer 104. In FIG. 2E, the data line 106c electrically connected with the drain electrode 106b is taken as the example.

As an example of the specific process step, the material for forming the source electrode and the drain electrode as well as the data line can be deposited on the structure as shown in FIG. 2D, then a desired pattern is formed through exposing, developing and etching. The pattern comprises the above source electrode and the drain electrode as well as the data line. The source electrode and the drain electrode as well as the data line may comprise a metal material, the metal material for example being selected from a group consisting of tungsten, aluminum, copper, silver, molybdenum and an alloy thereof. Certainly, the specific process step is not a limitation to the present invention. The skilled person in the art may also select other materials and manners for forming the source electrode and the drain electrode as well as the data line based on specific applications and requirements.

Further, a passivation layer can be formed on the structure as shown in FIG. 2E, and a pixel electrode is formed on the passivation layer so as to enable the pixel electrode to be electrically connected with the source electrode or the drain electrode of the thin film transistor through a via hole arranged in the passivation layer. For example, a passivation material layer can be formed on the structure as shown in FIG. 2E, then a desired pattern is formed through exposing, developing and etching, and the pattern comprises a passivation layer that comprises a via hole; thereafter, a pixel electrode material is deposited on the passivation layer, then a desired pattern is formed through exposing, developing and etching, and the pattern comprises a pixel electrode. The pixel electrode may be electrically connected with the source electrode or the drain electrode of the thin film transistor through the via hole arranged in the passivation layer. The passivation layer may be formed by a single layer of silicon nitride ($SiN_x$), silicon oxide ($SiO_2$) or silicon oxynitride (SiNO), or formed by a multilayer structure consisting of these materials. The pixel electrode may be formed by ITO or IZO. Since the structures and manufacturing process of the passivation layer and the pixel electrode are well known by the skilled person in the art, they will not be described in detail here.

Although the exemplary embodiments of the present invention have been described in detail with reference to the drawings, such descriptions should be regarded as illustrative or demonstrative, rather than restrictive. The present invention is not limited to the disclosed embodiments. The different embodiments described above and in the claims can also be combined. When carrying out the present invention as claimed, the skilled person in the art, based on the study on the drawings, the description and the claims, can understand and carry out other variants of the disclosed embodiments, and these variants also fall within the protection scope of the present invention.

In the claims, the word "comprise" does not exclude presence of other components or steps. The mere fact that several technical measures are stated in mutually different dependent claims does not mean that the combination of these technical measures cannot be used advantageously.

The invention claimed is:

1. A display substrate comprising a base substrate and a thin film transistor arranged on the base substrate, the thin film transistor comprising a gate, a gate insulating layer, an oxide semiconductor active layer as well as a source electrode and a drain electrode arranged on the base substrate sequentially,
wherein the display substrate further comprises an ultraviolet blocking layer, the ultraviolet blocking layer comprising a first portion arranged between the base substrate and the oxide semiconductor active layer, and
wherein the display substrate further comprises a gate line arranged on the base substrate and a data line located above the gate line and electrically connected with one of the source electrode and the drain electrode of the thin film transistor, wherein an oxide semiconductor active cushion is arranged between the gate line and the data line at the crossover of the gate line and the data line, and the ultraviolet blocking layer further comprises a second portion arranged between the base substrate and the oxide semiconductor active cushion.

2. The display substrate according to claim 1, wherein the ultraviolet blocking layer comprises ITO or IZO.

3. The display substrate according to claim 1, wherein the first portion of the ultraviolet blocking layer is arranged between the base substrate and the gate.

4. The display substrate according to claim 1, wherein the first portion of the ultraviolet blocking layer at least partly overlaps with a projection area of the oxide semiconductor active layer on a plane where the ultraviolet blocking layer locates.

5. The display substrate according to claim 1, wherein the second portion of the ultraviolet blocking layer is arranged between the base substrate and the gate line.

6. The display substrate according to claim 1, further comprising a transparent conducting layer arranged on the base substrate, the transparent conducting layer being located in a pixel area of the display substrate and being in the same layer as the ultraviolet blocking layer.

7. The display substrate according to claim 1, wherein the second portion of the ultraviolet blocking layer at least partly overlaps with a projection area of the oxide semiconductor active cushion on a plane where the ultraviolet blocking layer locates.

8. A display device comprising a display substrate, the display substrate comprising a base substrate and a thin film transistor arranged on the base substrate, the thin film transistor comprising a gate, a gate insulating layer, an oxide semiconductor active layer as well as a source electrode and a drain electrode arranged on the base substrate successively,
wherein the display substrate further comprises an ultraviolet blocking layer, the ultraviolet blocking layer comprising a first portion arranged between the base substrate and the oxide semiconductor active layer, and
wherein the display substrate further comprises a gate line arranged on the base substrate and a data line located above the gate line and electrically connected with one of the source electrode and the drain electrode of the thin film transistor, wherein an oxide semiconductor active cushion is arranged between the gate line and the data line at the crossover of the gate line and the data line, and the ultraviolet blocking layer further comprises a second portion arranged between the base substrate and the oxide semiconductor active cushion.

9. The display device according to claim 8, wherein the display device is a liquid crystal display device.

10. The display device according to claim 9, wherein the liquid crystal display device operates in an ADS display mode.

11. A method for manufacturing a display substrate, comprising:
forming a gate, a gate insulating layer, an oxide semiconductor active layer as well as a source electrode and a drain electrode on a base substrate sequentially, so as to form a thin film transistor,
wherein the method further comprises: forming an ultraviolet blocking layer before forming the oxide semiconductor active layer such that the ultraviolet blocking layer comprises a first portion arranged between the base substrate and the oxide semiconductor active layer,
wherein: the step of forming a gate further comprises forming a gate line; the step of forming an oxide semiconductor active layer further comprises forming an oxide semiconductor active cushion located above the gate line; and the step of forming a source electrode and a drain electrode further comprises forming a data line electrically connected with one of the source electrode and the drain electrode, and
wherein the ultraviolet blocking layer further comprises a second portion arranged between the base substrate and the oxide semiconductor active cushion.

12. The method according to claim 11, wherein the ultraviolet blocking layer comprises ITO or IZO.

13. The method according to claim 11, wherein the ultraviolet blocking layer is formed before the gate is formed such that the first portion of the ultraviolet blocking layer is arranged between the base substrate and the gate.

14. The method according to claim 11, wherein the first portion of the ultraviolet blocking layer at least partly overlaps with a projection area of the oxide semiconductor active layer on a plane where the ultraviolet blocking layer locates.

15. The method according to claim 11, wherein the second portion of the ultraviolet blocking layer is arranged between the base substrate and the gate line.

16. The method according to claim 11, wherein the step of forming an ultraviolet blocking layer further comprises forming a transparent conducting layer on the base substrate.

17. The method according to claim 11, wherein the second portion of the ultraviolet blocking layer at least partly overlaps with a projection area of the oxide semiconductor active cushion on a plane where the ultraviolet blocking layer locates.

* * * * *